United States Patent [19]

Schneller et al.

[11] Patent Number: 4,699,867

[45] Date of Patent: Oct. 13, 1987

[54] RADIATION-SENSITIVE POSITIVE WORKING COMPOSITION AND MATERIAL WITH AQUEOUS-ALKALINE SOLUBLE ACRYAMIDE OR METHACRYAMIDE COPOLYMER HAVING HYDROXYL OR CARBOXYL GROUPS

[75] Inventors: Arnold Schneller, Mainz; Ulrich Geissler, Hochheim, both of Fed. Rep. of Germany

[73] Assignee: Hoechst Aktiengesellschaft, Fed. Rep. of Germany

[21] Appl. No.: 800,965

[22] Filed: Nov. 22, 1985

[30] Foreign Application Priority Data

Nov. 23, 1984 [DE] Fed. Rep. of Germany ....... 3442756

[51] Int. Cl.$^4$ .......................... G03C 1/60; G03C 1/54
[52] U.S. Cl. .................................. 430/192; 430/165; 430/191; 430/270
[58] Field of Search ................ 430/192, 270, 191, 165

[56] References Cited

U.S. PATENT DOCUMENTS

| | | | |
|---|---|---|---|
| 3,697,274 | 10/1972 | Herrmann | 96/36.3 |
| 3,900,325 | 8/1975 | Christensen et al. | 430/191 |
| 4,164,421 | 8/1979 | Shinozaki et al. | 430/191 |
| 4,387,152 | 6/1983 | Stahlhofen | 430/191 |
| 4,439,516 | 3/1984 | Cernigliaro et al. | 430/323 |
| 4,456,679 | 6/1984 | Leyrer et al. | 430/326 |
| 4,572,887 | 2/1986 | Geissler | 430/288 |
| 4,581,321 | 4/1986 | Stahlhofen | 430/191 |
| 4,642,282 | 2/1987 | Stahlhofen | 430/192 |

OTHER PUBLICATIONS

Kirk–Othmer, *Encyclopedia of Polymer Science and Technology*–vol. 1, (1964), p. 190.
Kirk–Othmer, *Encyclopedia of Chemical Technology*–vol. 2, (1978), pp. 440–447.
Martin, R. W., *The Chemistry of Phenolic Resins*–(1956), pp. 17–19.

*Primary Examiner*—Charles L. Bowers, Jr.
*Attorney, Agent, or Firm*—Schwartz, Jeffery, Schwaab, Mack, Blumenthal & Evans

[57] ABSTRACT

Disclosed is a radiation-sensitive composition, a recording material prepared therewith, and process therefor. The invention is suitable for the production of printing plates and photoresists. The composition contains a 1,2-quinonediazide or a combination of (1) a compound which, under the action of actinic radiation, forms a strong acid, and (2) a compound which possesses at least one acid-cleavable C—O—C bond, the solubility of which in a liquid developer is increased by the action of acid and, as the binder, a polymer having lateral crosslinking groups of the formula —CH$_2$OR, in which R is a hydrogen atom, a lower alkyl group, acyl group or hydroxyalkyl group. After being exposed and developed, the composition can be thermally cured and results in an image stencil exhibiting a clean background.

17 Claims, No Drawings

RADIATION-SENSITIVE POSITIVE WORKING COMPOSITION AND MATERIAL WITH AQUEOUS-ALKALINE SOLUBLE ACRYAMIDE OR METHACRYAMIDE COPOLYMER HAVING HYDROXYL OR CARBOXYL GROUPS

BACKGROUND OF THE INVENTION

The present invention relates to a positive-working, radiation- or photosensitive composition comprising, as the essential constituents, (A) a polymeric binder which is insoluble in water and soluble in aqueous-alkaline solutions; and (B) a 1,2-quinonediazide or a combination of
1. a compound which, under the action of actinic radiation, forms a strong acid and
2. a compound which possesses at least one cleavable C—O—C bond, the solubility of which in a liquid developer is increased by the action of acid, and to a radiation-sensitive recording material comprising a support coated with a layer of said composition and suitable for the production of printing plates and photoresists.

Positive-working photosensitive compositions, i.e. compositions which comprise the above-mentioned constituents and the photosensitive layers of which are rendered soluble in the exposed areas, are known.

The vast majority of these compositions contain phenol/formaldehyde condensation products, particularly novolaks, as alkali-soluble binders. Other alkali-soluble binders which can be used and which are described in the art, include homo- and copolymers of vinyl phenol, copolymers of maleic acid anhydride and styrene, copolymers of vinyl acetate and crotonic acid, copolymers of methyl methacrylate and methacrylic acid, or novolaks which have been modified by chloroacetic acid. However, these binders have been unable to gain general acceptance. Virtually all commercial products which are known, therefore, contain novolaks. Novolaks used as binders, however, have disadvantages for particular applications.

A fundamental drawback of the novolaks resides in their insufficient thermal stability. If, for example, dry plasma etching is employed in the production of integrated circuits by means of photoresist processes, the photoresist used must stand the high temperatures occurring in the process without any deformation or other change of the image. The novolaks customarily employed do not, however, meet this requirement. As the softening range of the novolaks is between 120° C. and 130° C., the resists start to flow when these temperatures are exceeded. As a consequence thereof, the structures get blurred, which results in a poor resolution.

A similar disadvantage of the novolaks is observed when they are used as binders in positive printing plates.

For increasing the print run the printing plates are baked for some minutes at temperatures of about 200° C. to 250° C. after development. During this stage, parts of the novolak and other layer constituents may escape from the layer and redeposit on the bared aluminum surface, which in the printing process leads to scumming, i.e., to an undesired ink acceptance of nonimage areas.

If positive layers are employed in dry resist processes, the layers must be soft and flexible to ensure an unobjectionable processing. In the subsequent electroplating step, the softness of the layer may cause problems, due to, for example, diffusion of low molecular weight layer constituents from the layer and undercutting of resist edges.

There have been proposed a number of ways to overcome these disadvantages.

In U.S. Pat. No. 4,439,516, o-quinonediazides are combined with polyvinylphenols. It is true that due to the high softening range (above 150° C.) of the employed polyvinylphenol, the photoresists obtained are capable of standing elevated temperatures without any deformation of the image, but at the same time this parameter has a disadvantageous effect on the mechanical properties of photoresist layers of this type. These resists cannot be processed as dry resists in the form of rolls, since in these processes, a thermoplastic flow at about 100° C.-130° C. is required for lamination to a substrate. Furthermore, layers containing these substances are very brittle and have a tendency to splinter when being cut.

U.S. Pat. No. 4,456,679 has disclosed a positive-working mixture which in addition to the photosensitive o-nitrocarbinol ester groups contains crosslinking compounds which, under the action of heat, react with the carboxyl groups present following exposure, whereby a covalent bond is formed. The disadvantages of this process reside in the known low photosensitivity of the o-nitrocarbinol esters and in that, after imagewise exposure and development, a second overall exposure is necessary for the thermal crosslinking of the resist layer.

Furthermore, German Offenlegungsschrift No. 32 46 037 and U.S. Pat. No. 4,387,152 describe low-molecular weight compounds possessing methylol groups, methylolether groups, or methylolester groups capable of crosslinking, which are used as additives in mixtures of o-quinonediazides and novolaks and, at elevated temperatures, effect thermal crosslinking with the novolak and thus lead to higher print runs. In the baking step or in electroplating baths these additives can, however, escape from the layer and cause problems.

In the prior, not prepublished German Offenlegungsschrift No. 33 29 443, there has been disclosed a photopolymerizable mixture comprising ethylenically unsaturated polymerizable compounds, customary binders and photoinitiators, as well as a binder with thermally crosslinkable side groups of the formula —CH$_2$OR, with R denoting hydrogen, an alkyl group, an acyl group or a hydroxyalkyl group.

SUMMARY OF THE INVENTION

It is accordingly an object of the present invention to provide a positive-working radiation-sensitive composition capable of producing relief images or resists of high resolution, good thermal stability and resistance to solvents, etching solutions and electroplating baths.

It is another object of the invention to provide a composition, as above, which does not contain any constituents that, upon heating, release volatile products which would impair the image background.

It is yet another object of the invention to provide a radiation-sensitive recording material from the above composition.

It is still another object of the invention to provide a process for producing heat resistant recorded relief images utilizing the above radiation-sensitive recording material.

These objects are achieved by a radiation-sensitive composition, comprising (A) a polymeric binder which is insoluble in water and soluble in aqueous-alkaline solutions; and (B) one of a 1,2-quinonediazide and a mixture of (1) a compound forming a strong acid under the action of actinic radiation, and (2) a cleavable compound having at least one acid-cleavable C—O—C bond, the solubility of which in a liquid developer is increased by the action of acid; wherein the binder is a polymer possessing crosslinking side groups of the formula —CH₂OR, in which R is selected from the group consisting of a hydrogen atom, a lower alkyl group, a lower acyl group, and a lower hydroxyalkyl group.

The objects of the invention are further achieved by a radiation sensitive recording material made from the above composition.

The objects of the invention are still further achieved by a process for producing heat-resistant recorded relief images, comprising the steps of imagewise exposing radiation-sensitive recording material, the material including a radiation-sensitive layer and a layer support; developing the exposed recording material with an alkaline developer solution, and heating the developed recording material to a temperature of from about 80° C. to about 250° C. for a period of from about 2 to about 60 minutes; wherein said radiation-sensitive layer comprises the above-described composition.

DETAILED DESCRIPTION OF THE PREFERRED EMBODIMENTS

In accomplishing the objects of the invention, there is proposed a radiation-sensitive composition comprising
(A) a polymeric binder which is insoluble in water and soluble in aqueous-alkaline solutions; and
(B) a 1,2-quinonediazide or a combination of
1. a compound which, under the action of actinic radiation, forms a strong acid and
2. a compound which possesses at least one C—O—C bond, the solubility of which in a liquid developer is increased by the action of acid.

In the composition according to the instant invention, the binder is a polymer possessing lateral crosslinking groups of the formula —CH₂OR, in which R denotes a hydrogen atom or a lower alkyl group, acyl group or hydroxyalkyl group.

In accordance with the invention, there is also proposed a radiation-sensitive recording material comprising a support and a radiation-sensitive layer of the above-defined composition.

Finally, there is proposed, in accordance with this invention, a process for producing heat-resistant recorded relief images, in which a recording material as described above is imagewise exposed, developed with an aqueous-alkaline developer solution and the relief image obtained is heated to an elevated temperature.

In the process according to the invention, the photoresist layer contains, as the binder, a polymer with crosslinking side groups of the formula —CH₂OR, in which R denotes a hydrogen atom, a lower alkyl group, acyl group or hydroxyalkyl group, and the developed layer is heated for between about 2 and about 60 minutes to a temperature between about 80° C. and about 250° C. The crosslinking —CH₂OR groups are usually linked to an aromatic ring carbon atom or to an amide nitrogen atom.

Preferably, the polymer is a copolymer possessing units of the formula I

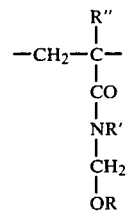

in which
R' denotes a hydrogen atom or an alkyl group,
R" denotes a hydrogen atom or a methyl group, and
R has the above-indicated meaning.

If R' denotes an alkyl group, it generally contains 1 to 6, preferably 1 or 2, carbon atoms. Special preference is given to compounds with R' being H or methyl.

If R is an alkyl group, it generally contains 1 to 6, preferably 1 to 4, carbon atoms; if R is an acyl group, it generally contains 1 to 4, preferably 1 or 2, carbon atoms. In general, preference is given to compounds with R being alkyl.

In addition to the units of the above formula, the copolymer may include further units.

Upon being heated in the presence of polymers with free hydroxyl groups or free carboxyl groups, polymers containing the above-described monomer units yield crosslinked products. Therefore, they can be present in a mixture with polymeric binders which carry such substituents. Particular preference is given to binders which include both types of functional units, i.e., units of the formula I and units with free OH groups or COOH groups, in one molecule.

Compounds having aliphatic hydroxyl groups and compounds having aromatic hydroxyl groups can be used as monomeric units having free hydroxyl groups.

Examples of units having aliphatic hydroxyl groups are: hydroxyalkyl acrylates and hydroxyalkyl methacrylates, hydroxyalkoxyalkyl acrylates and hydroxyalkoxyalkyl methacrylates, glycerol monoacrylate and glycerol monomethacrylate, trimethylolpropane monoacrylate and trimethylolpropane monomethacrylate, hydroxyalkyl vinyl ether, and vinyl alcohol.

In general, units possessing aromatic hydroxyl groups are preferred, because they also impart the desired solubility in alkaline media.

Suitable units having aromatic hydroxyl groups correspond to the following general formula:

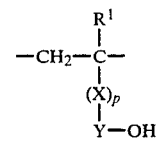

in which
R¹ denotes a hydrogen atom, an alkyl group, a halogen atom or a cyano group;
Y denotes a substituted or unsubstituted mono- or binuclear aromatic group;
X denotes a divalent linking member; and
p=0 or 1.
Y preferably denotes a mononuclear aromatic group which is optionally substituted by halogen atoms or alkyl groups or alkoxy groups having 1 to 4 carbon atoms. Binuclear groups can be substituted in the same manner. X preferably is, or contains, an acid amide group or a carboxylic acid ester moiety.

Preferred examples of such units are N-(4-hydroxyphenyl)methacrylamide, N-(3-hydroxyphenyl)acrylamide and N-(5-hydroxynaphth-1-yl)-methacrylamide, o-, m- and p-hydroxyphenyl acrylate or methacrylate, 2-hydroxy-3-(3'-hydroxybenzoyloxy)propyl methacrylate, 2-hydroxy-3-(2'-hydroxynaphthoyloxy)propyl methacrylate and o-, m- and p-hydroxystyrene.

Suitable monomer units having free carboxyl groups include units of acrylic acid, methacrylic acid, maleic acid, itaconic acid, vinylbenzoic acid, 4-(acrylamido)-benzoic acid and 4-(methacrylamido)benzoic acid.

In addition to the substituted units of methacrylamide or acrylamide that are capable of crosslinking and the units having free hydroxy groups and/or carboxyl groups, the copolymers can contain further units.

Examples of compounds that form further suitable units include styrene, α-chlorostyrene, α-methylstyrene, 2-, 3-, or 4-chloromethyl styrene, 4-bromostyrene, methylvinyl ether, ethylvinyl ether, propylvinyl ether, butylvinyl ether, acrylonitrile, acrolein, butadiene, the methyl, ethyl, propyl, butyl, pentyl, hexyl and 2-ethylhexyl esters of acrylic acid and methacrylic acid, vinyl acetate, vinyl-isobutyl ketone, maleic acid anhydride, ethylene, and propylene. Among these, the acrylic and methacrylic acid esters, especially those having 4 to 12 carbon atoms, and styrene are particularly preferred.

The crosslinking density achieved when the composition is heated depends on the number of crosslinking and crosslinkable groups contained in the polymer molecule and on the ratio of substituted acid amide groups to carboxylic acid groups and/or OH groups. Advantageously, the molar ratio of $ROCH_2NR'$ to COOH or OH is between about 0.1:1 and about 1.5:1, preferably between about 0.2:1 and about 1.0:1.

The quantitative proportion of carboxyl group-containing or phenolic hydroxyl group-containing units in the copolymer is determined by the demand for a trouble-free, rapid development with aqueous-alkaline solutions which are preferably free from organic solvents, and for the highest possible degree of resistance to overdevelopment of the unexposed areas. These properties are also influenced by the mean molecular weight of the polymer and the other layer constituents. In general, the acid number should vary between about 50 and about 300, preferably between about 100 and about 220, if carboxyl group-containing units are used.

If hydroxyl group-containing units are used, the corresponding OH number should be in the range of from about 100 to about 400, preferably from about 150 to about 300. In those cases where it is possible to employ a developer which contains organic solvents, the acid number or OH number can be lower.

The preferred terpolymers in general contain from about 2 to about 50 mole percent, preferably from about 5 to about 40 mole percent, of substituted acid amide units that are capable of crosslinking. The proportion of carboxyl units and/or OH units corresponds to the acid numbers or OH numbers indicated above. If carboxyl group-containing units are used exclusively, these are usually present in an amount of from about 5 to about 50 mole percent, preferably from about 10 to about 40 mole percent. Copolymers possessing OH units are usually present in an amount of from about 20 to about 95 mole percent, preferably from about 30 to about 80 mole percent.

The molecular weight of the copolymers can vary within wide limits. Preference is given to polymers having a molecular weight between about 500 and about 200,000, in particular between about 2,000 and about 100,000. The binders are preferably produced by mass polymerization, emulsion polymerization or solution polymerization of the corresponding monomers, in the presence of cationic or free-radical initiators.

To produce the compositions according to this invention, the above-described binder is combined with photosensitive compounds or mixtures, the solubility of which in aqueous-alkaline developer solutions is increased by exposure. They include, above all, o-quinonediazides and combinations of photolytic acid donors and compounds which can be split by acid.

Naphthoquinone-(1,2)-diazide-(2)-4- or -5-sulfonic acid esters or amides are examples of preferably employed o-quinonediazides. Among these, particular preference is given to the esters, and especially to the esters of the 5-sulfonic acids. Suitable compounds of this type are known and described, for example, in German Pat. No. 938,233 and in German Offenlegungsschriften Nos. 21 31 377, 25 47 905 and 28 28 017.

The amount of o-quinonediazide compounds in general is between about 3 and about 50 percent by weight, preferably between about 7 and about 35 percent by weight, relative to the non-volatile constituents of the composition.

Good results are also achieved when materials based on compounds which can be split by acid are employed in the composition according to this invention.

As the compounds, which can be split by acid, the following are to be mentioned in the first place:

(a) compounds which have at least one orthocarboxylic acid ester and/or carboxylic acid amide acetal moiety; the compounds can also have a polymeric character and the moieties indicated can be present as linking elements in the main chain or as lateral substituents, (b) oligomeric or polymeric compounds with recurring acetal and/or ketal moieties in the main chain, and (c) compounds having at least one enolether or N-acylaminocarbonate moiety.

Compounds which can be split by acid, corresponding to type (a), which are used as components of radiation-sensitive compositions, are described in detail in European laid-open Application No. 0 022 571; compositions which contain compounds of type (b) are described in German Pat. No. 23 06 248 and in German Pat. No. 27 18 254; compounds of type (c) are described in European laid-open Application No. 0 006 626 and in European laid-open Application No. 0 006 627.

The type and the quantity of the binder and the cleavable compound can differ, depending on the intended use; preferably the binder is present in proportions ranging between about 30 and about 90% by weight, particularly preferably between about 55 and about 85% by weight. The proportion of the cleavable compound can be varied between about 5 and about 70% by weight, preferably between about 5 and about 40% by weight.

Numerous other oligomers and polymers can additionally be used, for example, phenol resins of the novolak type of vinyl polymers, for example, polyvinyl acetals, polymethacrylates, polyacrylates, polyvinyl ethers and polyvinyl pyrrolidones, which themselves can be modified by comonomers.

The most favorable proportion of these additives depends on the application-related requirements and on the influence on the conditions of development and it generally does not exceed about 20% of the polymer having crosslinking groups. To meet special requirements, such as flexibility, adhesion, gloss, etc., the photosensitive layer can additionally contain small quantities of substances such as, for example, polyglycols, cellulose ethers, e.g. ethyl cellulose, surfactants, dyes, and finely divided pigments.

As the radiation-sensitive components which preferably form or split off strong acids when they are irradiated, a great number of known compounds and mixtures are suitable for example, diazonium, phosphonium, sulfonium and iodonium salts, halogen compounds, o-quinonediazide sulfochlorides and organo metal/organo halogen combinations.

The above-indicated diazonium, phosphonium, sulfonium and iodonium compounds are generally employed in the form of their salts which are soluble in organic solvents, usually as the products resulting from the separation with complex acids, for example, tetrafluoroboric acid, hexafluorophosphoric acid, hexafluoroantimonic acid and hexafluoroarsenic acid.

In principle, it is possible to use as halogen-containing radiation-sensitive compounds which form hydrohalogenic acid, any organic halogen compounds which are also known as photochemical free-radical starters, for example, those which have more than one halogen atom on a carbon atom or in an aromatic ring. Examples of such compounds are described in U.S. Pat. Nos. 3,515,552, 3,536,489, and 3,779,778, in German Pat. No. 26 10 842 and in German Offenlegungsschriften Nos. 22 43 621, 27 18 259 and 33 37 024. Of these compounds, the s-triazine derivatives containing two halogen methyl groups, in particular, trichloromethyl groups, and an aromatic or unsaturated substituent in the triazine nucleus, such as those described in German Offenlegungsschriften Nos. 27 18 259 and 33 37 024, are preferred. The action of these halogen-containing compounds can also be spectrally influenced and enhanced by known sensitizers.

Suitable acid donors are, for example: 4-(di-n-propylamino)-benzene diazonium tetrafluoroborate, 4-p-tolymercapto-2,5-diethoxy-benzene diazonium hexafluorophosphate and 4-p-tolymercapto-2,5-diethoxy-benzene diazonium tetrafluoroborate, diphenylamine-4-diazonium sulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethylquinoline, 2,4-dimethyl-1-tribromoacetylbenzene, 3-nitro-1-tribromoacetylbenzene, 4-dibromoacetylbenzoic acid, 1,4-bis-dibromomethylbenzene, tris-dibromomethyl-s-triazine, 2-(6-methoxynaphth-2-yl)-, 2-(naphth-1-yl)-, 2-(naphth-2-yl)-, 2-(4-ethoxyethylnaphth-1-yl)-, 2-benzopyran-3-yl)-, 2-(4-methoxyanthrac-1-yl)-, 2-(4-styryl-phenyl)-, 2-(phenanthr-9-yl)-4,6-bis-trichloromethyl-s-triazine and the compounds specified in the examples.

The amount of acid donor can also vary widely, depending on its chemical nature and on the composition of the mixture. Favorable results are obtained using from 0.1 to about 10% by weight, preferably from about 0.2 to about 5% by weight, based on total solids. Especially in the case of copying layers having thicknesses exceeding 10 μm, it is advisable to use a relatively small amount of acid donor.

The photosensitive composition can additionally be admixed with soluble or finely divided dispersible dyes and, depending on the intended purpose, also with UV absorbers. Dyes which have been found to be particularly useful are the triphenylmethane dyes, in particular in the form of their carbinol bases. The most favorable quantitative ratios of the components can easily be determined by preliminary tests in each individual case.

Any materials which are conventionally industrially employed in copying processes are suitable for use as supports for the photosensitive compositions. Examples which may be mentioned include plastic films, insulation boards provided with a copper coating, mechanically or electrochemically grained and, if appropriate, anodically oxidized aluminum, wood, ceramics, glass, and silicon, the surface of which may have been chemically converted, for example, to form silicon nitride or silicon dioxide.

Preferred supports for layers exceeding 10 μm in thickness are plastic films which then serve as temporary supports for transfer layers. For this purpose and also for color proofing films, polyester films, for example, polyethylene terephthalate films, are preferred. Polyolefin films, for example, polypropylene films, are, however, also suitable. The supports used for layer thicknesses below about 10 μm are, in most cases, metals. Support materials which can be used for offset printing plates comprise: mechanically or chemically grained and, if appropriate, anodically oxidized aluminum, which additionally may have been chemically pretreated, for example, with polyvinyl phosphonic acid, silicates or phosphates.

Coating may be effected directly or by layer transfer from a temporary support to circuit-board materials comprising insulation boards having a copper coating on one or both sides, to glass or ceramic materials which may have been subjected to an adhesion-promoting pretreatment, and to silicon wafers. It is also possible to coat wood, textiles, and the surfaces of a great number of materials, which are advantageously imaged by projection and are resistant to the action of alkaline developers.

The composition according to the present invention has a good shelf life, regardless of whether it is used as a solution or in the solid form, as a dry resist. Even after months of storage it can be processed easily and without problems. Compared to freshly prepared layers, no differences are observed in respect of laminatability, developability and resistance to overdevelopment.

The customary light sources, for example, fluorescent tubes, pulsed xenon lamps, metal halide doped high pressure mercury vapor lamps, and carbon arc lamps may be used for exposure.

In this specification, the term irradiation pertains to the action of actinic electromagnetic radiation in the wavelength range below about 500 nm. Any radiation sources which emit in this wavelength range are basically suitable.

It is advantageous to use laser irradiation apparatus, in particular, automatic processing units, which are equipped with an argon ion laser as the radiation source.

Irradiation can also be effected by means of electron beams. In this case, acid-forming compounds which, in the usual sense, are non-photosensitive can be used as the initiators of the solubilizing reaction, for example, halogenated aromatic compounds or halogenated polymeric hydrocarbons. It is also possible to use x-rays for the image formation.

The imagewise exposed or irradiated layer can be removed in a known manner, using practically the same developers as employed for commercial naphthoquinone diazide layers and photoresist compositions or the copying behavior of the novel materials can advantageously be adjusted to the customary auxiliaries, such as developers and program-controlled spray developing apparatus. The aqueous developer solutions can contain, for example, alkali metal phosphates, alkali metal silicates or alkali metal hydroxides, and, in addition, surfactants and optionally relatively small amounts of organic solvents. In particular cases, it is also possible to use solvent/water mixtures as developers. The most favorable developer can be selected by means of tests which are carried out with the layer used in each case. If required, development can be mechanically assisted.

The use of positive-working materials offers the advantage that the resist layer remaining after the first imagewise exposure can be further differentiated, optionally after etching or metal deposition steps have been performed, by another exposure step.

Fully prepared layer supports, such as circuit boards or silicon wafers, which have been covered by means of the above-described process steps, can be subjected to a high temperature treatment, in the course of which the layer is thermally cured.

It is assumed that in this treatment an interpenetrating network is formed which is responsible for the good mechanical, thermal and chemical properties. This thermal treatment is in general carried out at temperatures between about 80° C. and about 200° C. for approximate treatment times of 5 to 60 minutes.

The compositions according to the invention produce resist compositions which are distinguished by a high flexibility and mechanical strength in the unexposed state and by a high heat-resistance in the cured state. If desired, layers of this type can be differentiated several times and finally cured, if required. The cured masks are resistant to atmospheric, thermal and, in particular, chemical influences for prolonged time periods.

Although, in the above descriptive section, the invention has been preferably described with regard to its use for the manufacture of photoresist masks, it is not restricted to this use. It is applicable to any case where the object is to produce imagewise stencils of particularly high thermal, mechanical and chemical resistance. This is also the case in other photoresist applications, for example in the production of solder masks, which are intended to be resistant to aggressive baths and/or to elevated temperatures.

Processing of the mixture is preferably performed by means of the dry resist technique. However, the mixture is also well suited for being processed by means of the liquid resist technique, i.e. by applying a solution of the components to the final layer support, both in the production of printed circuit boards and of solder masks.

The mixture according to the invention is suitable also for the manufacture of offset printing plates, for example using aluminum, steel or chromium as support materials, which plates are intended to be baked in a known manner, after developing, to consolidate the image stencil. This process is described in British Pat. No. 1,154,749. However, in this mode of application heating should be carried out for a shorter time and at higher temperatures, in general for 2 to 20 minutes at temperatures within a range of 160° to 250° C. This can considerably increase the print run.

The examples which follow illustrate particular embodiments of the composition according to the invention. Unless otherwise indicated, percentages and quantity ratios are to be understood as units by weight. The quantities in the formulations are given in parts by weight (p.b.w.).

EXAMPLE 1

Coating solutions were prepared from
12 p.b.w. of one of the following terpolymers:
(a) N-(4-hydroxyphenyl)methacrylamide, styrene, N-butoxymethyl-methacrylamide (50:40:10) OH-number: 170;
(b) N-(4-hydroxyphenyl)methacrylamide, butyl methacrylate, N-butoxymethyl methacrylamide (45:30:25), OH number: 143;
(c) 4-hydroxystyrene, styrene, N-butoxymethyl methacrylamide (70:20:10), OH-number: 310;

3 p.b.w. of a polyacetal obtained from triethylene glycol and butyraldehyde, 0.1 p.b.w. of 2-(4-styrylphenyl)-4,6-bis-trichloromethyl-s-triazine, and 0.015 p.b.w. of crystal violet base, in 400 p.b.w. of ethanol and 250 p.b.w. of butanone.

These solutions were used to coat aluminum plates, one surface of which had been mechanically grained by means of wire brushes. The plates were then dried at 80° C. in a drying cabinet for 5 minutes.

The material, which had been presensitized in this way, was exposed under a 5 kW metal halide lamp for 8 seconds, and following a delay of 10 minutes, they were developed with the following solution:

5.3 p.b.w. of sodium metasilicate.9H$_2$O, 3.4 p.b.w. of trisodium phosphate.12H$_2$O, 0.3 p.b.w. of sodium dihydrogen phosphate (anhydrous), 91.0 p.b.w. of water.

In the developing process, those portions of the photosensitive layer, which had been struck by light were removed and the unexposed image areas remained on the support. In an offset press 100,000 good prints were obtained from the printing form so prepared.

In order to increase the print run and mechanical stability of the printing stencil, the printing form was subjected to a heat treatment. For this purpose, the dried printing form was heated, following development, to 190° C. for 5 minutes in a baking oven. As a result of being heated, the layer was crosslinked and thus cured, which became apparent by an increased print run of 300,000 copies. Scumming of the printing plate, which would have indicated that low molecular weight constituents had migrated out of the layer, was not observed. The cured printing stencil was resistant to chemicals and thus insoluble in organic solvents, such as acetone, alcohols, dimethyl formamide, ethyl acetate, toluene or xylene.

EXAMPLE 2

A coating solution was prepared from:

4.4 p.b.w. of a copolymer of N-(4-hydroxyphenyl)-N-methyl-acrylamide; styrene and N-butoxymethyl methacrylamide (55:25:20), OH-number: 220, 4.4 p.b.w. of a cresol/formaldehyde novolak having a softening point of 105°–120° C., and 1.1 p.b.w. of the esterification product obtained from 1 mol of 2,3,4-trihydroxybenzophenone and 3 mol of naphthoquinone-(1,2)-diazide-(2)-5-sulfonic acid chloride, in 45 p.b.w. of butanone and 45 p.b.w. of ethanol.

The solution was then filtered through a filter having a pore diameter of 0.2 μm (Millipore), spin-coated onto a wafer, the surface of which had been oxidized, and dried. A layer having a thickness of about 1.6 μm was obtained. The layer was dried for 10 minutes at 60° C.; thereafter, the wafer was contact exposed for 15 seconds through a test mask, with an intensity of 4.5 mW/cm$^2$ at a wavelength of 365 nm, and was developed with the solution of Example 1. The image patterns obtained had a resolution of 1.0 μm.

Subsequently, the resist stencil was baked at 150° C. for 30 minutes. When the structures were examined by means of a microscope, no rounding of the edges or flowing of the lines was detected. This suggests a reaction between the polymeric crosslinking agent and the novolak; obviously, this reaction starts at a temperature which is lower than the flow temperature of the novolak. Due to their high thermal stability wafers structured in this way are particularly suitable for subsequent dry etching processes.

For comparative reasons, a similar coating solution, which contained another 4.4 p.b.w. of the novolak instead of the copolymer, was processed in the same way and baked at 150° C. When the sample was inspected by means of a microscope, it was stated that in areas with very fine lines a clear flowing of the lines had occurred, and in a few cases the lines were even united.

EXAMPLE 3

As described in Example 2, a photoresist solution comprising 8.9 p.b.w. of a copolymer of 4-hydroxystyrene, styrene, and N-butoxymethyl methacrylamide (68:22:10), OH-number: 295; and 1.1 p.b.w. of the esterification product obtained from 1 mol of 2,3,4-trihydroxybenzophenone and 3 mol of naphthoquinone-(1,2)-diazide(2)-5-solfonic acid chloride, in 45 p.b.w. of butanone and 45 p.b.w. of ethanol, was spin-coated onto a wafer and exposed.

In this case, too, a heat-curable layer was obtained, which after the heat treatment possessed an excellent resistance to elevated temperatures and aggressive materials, such as HF plasma.

EXAMPLE 4

To prepare a positive dry resist, 40 p.b.w. of a copolymer of 4-hydroxystyrene, n-hexylmethacrylate and N-butoxymethyl methacrylamide (65:25:10), OH-number: 270, 11.7 p.b.w. of the polyacetal described in Example 1, 0.5 p.b.w. of 2-(4-ethoxy-naphth-1-yl)-4,6-bis-trichloromethyl-s-triazine, and 0.1 p.b.w. of crystal violet base were dissolved in 50 p.b.w. of ethanol and 30 p.b.w. of butanone.

This solution was spin-coated upon a 26 μm thick, biaxially stretched and heat-set polyethylene terephthalate film and then dried for 10 minutes at 60° C. A layer thickness of 25 μm resulted. As a protection against dust and scratches, a polyethylene covering film was additionally laminated to the layer.

To produce printed circuit boards, the covering film was peeled from this dry resist film and a commercial laminator was then used to laminate the dry-resist film to a cleansed, pre-heated support which comprised an insulating material provided with a 35 μm thick copper coating. After peeling off the support film and postdrying, the material was exposed under an original using a 5 kW metal halide lamp (distance 110 cm) for about 90 seconds and—following a delay of 10 minutes—developed for 1 minute in the developer indicated in Example 1.

The resist stencil produced in this way was baked at 150° C. for 30 minutes. In the subsequent etching processes or treatments in aggressive baths (for example, nickel plating or gold plating) the resist layer remained unchanged. To test the solvent resistance, the cured layer was left in isopropanol for 8 hours. It was not attacked by the solvent. It is also possible to expose, develop and heat-cure the resist layer again following a first differentiation and electroplating process.

EXAMPLE 5

Example 4 was repeated, with the exception that instead of the copolymer indicated therein, a copolymer comprising N-(4-hydroxyphenyl)methacrylamide, n-hexyl-methacrylate and N-butoxymethyl methacrylamide (40:45:15), OH-number: 162 was employed. In this Example, too, a positive-working dry resist was obtained, which after exposure and development could be heat-cured.

EXAMPLE 6

To produce an offset printing form, the following coating solution was prepared:

1.5 p.b.w. of a copolymer comprising methacrylic acid, styrene and N-butoxymethyl methacrylamide (30:50:20), acid number: 158, 7.4 p.b.w. of the novolak of Example 2, and 1.1 p.b.w. of the naphthoquinonediazide of Example 2, in 45 p.b.w. of butanone and 45 p.b.w. of ethanol.

This coating solution was applied to an electrochemically grained and anodically oxidized aluminum plate, the surface of which had additionally been treated with an aqueous solution of polyvinylphosphonic acid. The printing plate produced in this way was imagewise exposed under a transparent positive original and then developed with the solution described in Example 1. After thermal curing (5 minutes at 180° C.) high print runs were achieved using the printing form produced in accordance with this Example.

EXAMPLE 7

A solution comprised of 2.8 p.b.w. of a copolymer of methacrylic acid, styrene, and N-butoxymethyl methacrylamide (35:50:15), acid number: 173, 17.2 p.b.w. of the novolak of Example 2, and 2.5 p.b.w. of the naphthoquinonediazide of Example 2, in 85 p.b.w. of butanone, was filtered through a 0.2 μm filter and then spin-coated onto a wafer. The coated wafer was dried, at 60° C., in a circulating air cabinet for 30 minutes. A layer having a thickness of 1.6 μm resulted. Contact exposure was then performed with an intensity of 5 mW/cm$^2$, at a wavelength of 365 nm, followed by development with the solution of Example 1. The resist structures were not deformed by the subsequent thermal curing at 100° C. for 30 minutes and at 150° C. for another 15 minutes.

EXAMPLE 8

To produce a positive dry resist, a solution was prepared from 40 p.b.w. of a copolymer of 4-hydroxyphenyl methacrylate, 2-ethyl-hexylmethacrylate and N-butoxymethyl methacrylamide (68:20:12), OH-number: 230, 8.5 p.b.w. of bis-(5-ethyl-5-butyl-1,3-dioxan-2-yl)-ether of 2-ethyl-2-butyl-1,3-propanediol, 0.5 p.b.w. of the triazine of Example 4, and 0.05 p.b.w. of crystal violet base, in 50 p.b.w. of ethanol and 30 p.b.w. of butanone.

As described in Example 4, this solution was spin-coated onto a polyethylene terephthalate film. A layer thickness of 32 μm resulted.

The resulting dry resist film was dried at 60° C. for 10 minutes and then laminated to a copper-laminated base material. After the support film had been removed exposure through an original was performed for 40 seconds. Following a delay of 10 minutes development was carried out for 1 minute in the developer of Example 1.

After the deposition, by means of electroplating, of Cu and then of Pb/Sn in the bared areas, the plate was again exposed for 40 seconds and developed for 1 minute. Thereafter, baking was performed at 150° C. for 15 minutes. Subsequently, the bared areas were removed by etching with an ammoniacal solution of cupric chloride.

In this way it is, for example, possible to produce printed circuit boards by means of the copper technique, with the selective deposition of Cu and Pb/Sn at the mounting holes and on the copper circuit paths.

What is claimed is:

1. A radiation-sensitive composition, comprising in admixture:
    (A) a polymeric binder which is insoluble in water and soluble in aqueous-alkaline solutions, said binder being present in an amount sufficient to form a homogenous layer which is resistant to etching solutions and mechanical abrasion; and
    (B) one of a 1,2-quinonediazide and a mixture comprising
        (1) an amount of a compound forming a strong acid under the action of actinic radiation, said amount being sufficient to form enough of said acid upon exposure of said mixture to cleave a cleavable compound therein that has at least one acid-cleavable C—O—C bond, and
        (2) an amount of a cleavable compound having at least one acid-cleavable C—O—C bond, the solubility of which in a liquid developer is increased by the action of acid, said amount being sufficient to render said composition soluble in an aqueous-alkaline solution;
    wherein component (B) is radiation-sensitive and is present in an amount sufficient to alter the solubility of said composition in an aqueous-alkaline solution after imagewise irradiation, and wherein said binder (A) is a copolymer comprising units represented by the formula:

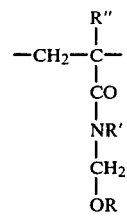

in which

R' denotes a hydrogen atom or an alkyl group, and

R" denotes a hydrogen atom or a methyl group and wherein said copolymer includes units formed from monomers wherein the units are selected from the group consisting of hydroxyl group-containing units, and carboxyl group-containing units and combinations of the above.

2. A radiation-sensitive composition as claimed in claim 1, wherein said hydroxyl group-containing monomer units are present in an amount corresponding to an OH number of from about 100 to about 400.

3. A radiation-sensitive composition as claimed in claim 1, wherein said carboxyl group-containing monomer units are present in an amount corresponding to an acid number of from about 50 to about 300.

4. A radiation-sensitive composition as claimed in claim 1, wherein said copolymer has a mean molecular weight of from about 500 to about 200,000.

5. A radiation-sensitive composition as claimed in claim 1, wherein said copolymer contains carboxyl group-containing monomer units selected from the group consisting of units of acrylic acid, methacrylic acid, maleic acid, itaconic acid, vinylbenzoic acid, 4-(acrylamido)benzoic acid and 4-(methacrylamido)benzoic acid.

6. A radiation-sensitive composition as claimed in claim 5, wherein said carboxyl group-containing monomer units are selected from the group consisting of acrylic acid and methacrylic acid units.

7. A radiation-sensitive composition as claimed in claim 1, wherein said copolymer contains hydroxyl group-containing monomer units selected from the group consisting of units containing aliphatic OH groups and units containing aromatic OH groups.

8. A radiation-sensitive composition as claimed in claim 7, wherein said units containing aliphatic OH groups are selected from the group consisting of hydroxyalkyl acrylates, hydroxyalkyl methacrylates, hydroxyalkoxyalkyl acrylates, hydroxyalkoxyalkyl methacrylates, glycerol monoacrylate, glycerol monomethacrylate, trimethylolpropane monoacrylate, trimethylolpropane monomethacrylate, hydroxyalkyl vinyl ether, and vinyl alcohol.

9. A radiation-sensitive composition as claimed in claim 8, wherein said copolymer includes additional units selected from the group consisting of styrene, a styrene derivative, an alkyl acrylate and an alkyl methacrylate.

10. A radiation-sensitive composition as claimed in claim 9, wherein said additional units are derived from an alkyl methacrylate having from 4 to 12 carbon atoms.

11. A radiation-sensitive composition as claimed in claim 7, wherein said units containing aromatic OH groups are selected from the group consisting of

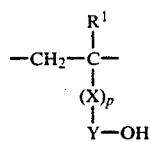

in which
- $R^1$ is selected from the group consisting of a hydrogen atom, an alkyl group, a halogen atom and a cyano group;
- Y is selected from substituted and unsubstituted mono- and binuclear aromatic groups;
- X denotes a divalent linking member; and
- p=0 or 1.

12. A radiation-sensitive composition as claimed in claim 11, wherein said units containing aromatic OH groups are selected from the group consisting of hydroxystyrene, an N-(hydroxyphenyl)acrylamide, an N-(hydroxyphenyl)methacrylamide, a hydroxyphenyl acrylate and a hydroxyphenyl methacrylate.

13. A radiation-sensitive composition as claimed in claim 11, wherein said copolymer includes additional units selected from the group consisting of styrene, a styrene derivative, and alkyl acrylate and an alkyl methacrylate.

14. A radiation-sensitive composition as claimed in claim 13, wherein said additional units are derived from an alkyl methacrylate having from 4 to 12 carbon atoms.

15. A radiation-sensitive composition as claimed in claim 1, wherein said composition contains a 1,2-quinonediazide in an amount of from about 3% to about 50% by weight.

16. A radiation-sensitive composition as claimed in claim 1, wherein said binder is present in an amount of from about 30% to about 90% by weight, said cleavable compound is present in an amount of from about 5% to about 70% by weight, and said acid-forming compound is present in an amount of from about 0.1% to about 10% by weight.

17. A radiation-sensitive recording material, comprising
a radiation-sensitive layer, and
a layer support; said radiation-sensitive layer comprising in admixture:
(A) a polymeric binder which is insoluble in water and soluble in aqueous-alkaline solutions, said binder being present in an amount sufficient to form a homogenous layer which is resistant to etching solutions and mechanical abrasion; and
(B) one of a 1,2-quinonediazide and a mixture of
  (1) an amount of a compound forming a strong acid under the action of actinic radiation, said amount being sufficient to form enough of said acid upon exposure of said layer to cleave a cleavable compound therein that has at least one acid-cleavable C—O—C bond, and
  (2) an amount of a cleavable compound having at least one acid-cleavable C—O—C bond, the solubility of which in a liquid developer is increased by the action of acid, said amount being sufficient to render said layer soluble in an aqueous-alkaline solution;
wherein component (B) is radiation-sensitive and is present in an amount sufficient to alter the solubility of said layer in an aqueous-alkaline solution after imagewise irradiation, and wherein said binder (A) is a copolymer comprising units represented by the formula:

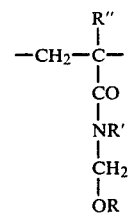

in which
- R' denotes a hydrogen atom or an alkyl group, and
- R" denotes a hydrogen atom or a methyl group and wherein said copolymer includes units formed from monomers wherein the units are selected from the group consisting of hydroxyl group-containing units, and carboxyl group-containing units and combinations of the above.

* * * * *